United States Patent [19]

Sawa

[11] Patent Number: 5,220,934
[45] Date of Patent: Jun. 22, 1993

[54] AUTOMATIC CONTINUOUS PROCESSING APPARATUS

[75] Inventor: Hironari Sawa, Tokorozawa, Japan

[73] Assignee: Surtech Co., Ltd., Japan

[21] Appl. No.: 788,776

[22] Filed: Nov. 6, 1991

[30] Foreign Application Priority Data

Mar. 29, 1991 [JP] Japan .................................. 3-66440
Jul. 19, 1991 [JP] Japan .................................. 3-179806

[51] Int. Cl.⁵ .............................................. B08B 3/04
[52] U.S. Cl. ........................................ 134/83; 134/134; 134/902
[58] Field of Search ................. 134/63, 66, 76, 83, 134/133, 134, 135, 902; 118/424; 354/322; 414/222

[56] References Cited

U.S. PATENT DOCUMENTS

| | | | |
|---|---|---|---|
| 3,373,755 | 3/1968 | Tajima et al. .................... | 134/134 |
| 3,559,553 | 2/1971 | Buechner ........................ | 134/83 X |
| 4,607,930 | 8/1986 | Castellarin ...................... | 134/76 X |
| 4,932,427 | 6/1990 | Yamada et al. ................... | 134/76 X |

*Primary Examiner*—Philip R. Coe
*Attorney, Agent, or Firm*—Jordan B. Bierman

[57] ABSTRACT

Apparatus for developing exposed photographic materials which is made up of one or more processing baths, with appropriate solutions therein, a support in each bath holding a work panel, a device for lifting the work panel upwardly, and a unit for carrying the work panel from one bath to the next. The panel is lifted by a pair of rollers attached to the lower end of the transporting unit. Within the transporting unit, receivers are located to retain the work panel while it is being transported. The apparatus also includes a guide for controlling the transporting unit along its appropriate path. The apparatus is small and provides improved processing efficiency and flexible operation. It enables the operator to optimize the processing time, even if the time required in individual baths is different.

1 Claim, 1 Drawing Sheet

AUTOMATIC CONTINUOUS PROCESSING APPARATUS

TECHNICAL FIELD AND RELATED ARTS

The present invention relates to a processing apparatus, specifically to an apparatus for preprocessing in plating.

For example, a work panel consisting of a multihole plate such as a through-hole printing board is subjected to a degreasing treatment in an alkaline solution to rinse for finishing prior to plating in order to improve an adhesiveness of the plated layer, and it is further subjected to the treatment in an acid solution and then to washing. Further, the work panel is sometimes subjected to the treatment with a volatile and hazardous organic solvent such as trichloroethylene.

Such apparatus for processing with alkaline and acid solutions and organic solvents comprises the processing baths containing various processing solutions and the roller and net conveyers disposed between the baths, wherein the work panels are transported in sequence to the processing baths to dip in the processing solutions contained therein and carry out the processing.

Further, there is available an apparatus in which a rack hanger is used in place of a conveyer to suspend work panels to transport them from bath to bath.

The above processing apparatuses in which work panels are transported by conveyers have the following problems:

1. there have to be installed the conveyers and processing baths having the sizes in compliance with those of the work panels, which results in the increase in the whole size of the apparatus;

2. a constant processing time in the processing baths and a limited size of the apparatus generate the necessity to adjust and control a conveyer speed, which results in lowering a processing efficiency;

3. a different processing time and a constant conveyer speed also generate another problem that the sizes of the processing baths have to be changed according to the respective processing time;

4. a squeezing mechanism is necessary in order to remove a processing solution drain remaining on the work panels after processing, which results in enlarging the whole size of the apparatus; and 5. where a volatile solvent and a processing solution having an irritative odor are used, the environmental pollution problems by an evaporated solvent and an odor are liable to take place and an investment for avoiding such problems is necessary.

Further, the apparatuses in which the work panels are transported by rack hangers have the incoveniences such as an operation of returning the rack hangers to the starting position after transporting the work panels and another troublesome jobs to mount and detach the work panels.

SUMMARY OF THE INVENTION

An object of the invention is to provide a small-sized apparatus for processing with a chemicals solution, which can provide an improved processing efficiency.

Another object of the invention is to provide a processing apparatus which can be flexibly operated to optimize the overall processing time even if the processing time in the respective baths would be different.

Still another object of the invention is to provide a processing apparatus with which an operator can work in an excellent working environment by minimizing the releasing of a vapor of a solvent and an irritative odor.

The above objects of the invention can be achieved by a processing apparatus comprising:

a) processing baths containing processing solutions, b) a supporting means disposed in each processing bath, which supports a work panel upward, c) a lifting means for the work panel held in the supporting means, d) a transporting unit disposed over the processing baths, the unit being driven by a driving means, e) a pair of rollers for rolling up and down the work panel lifted by the lifting means, the rollers being disposed oppositely to the processing bath on the lower end of the transporting unit, f) a receiving means for the work panel lifted by the lifting means, the receiving means being disposed in the transporting unit, and g) a guiding means for the transporting unit, the means being disposed over the processing baths along the path on which the processing baths are disposed.

Figure 1:
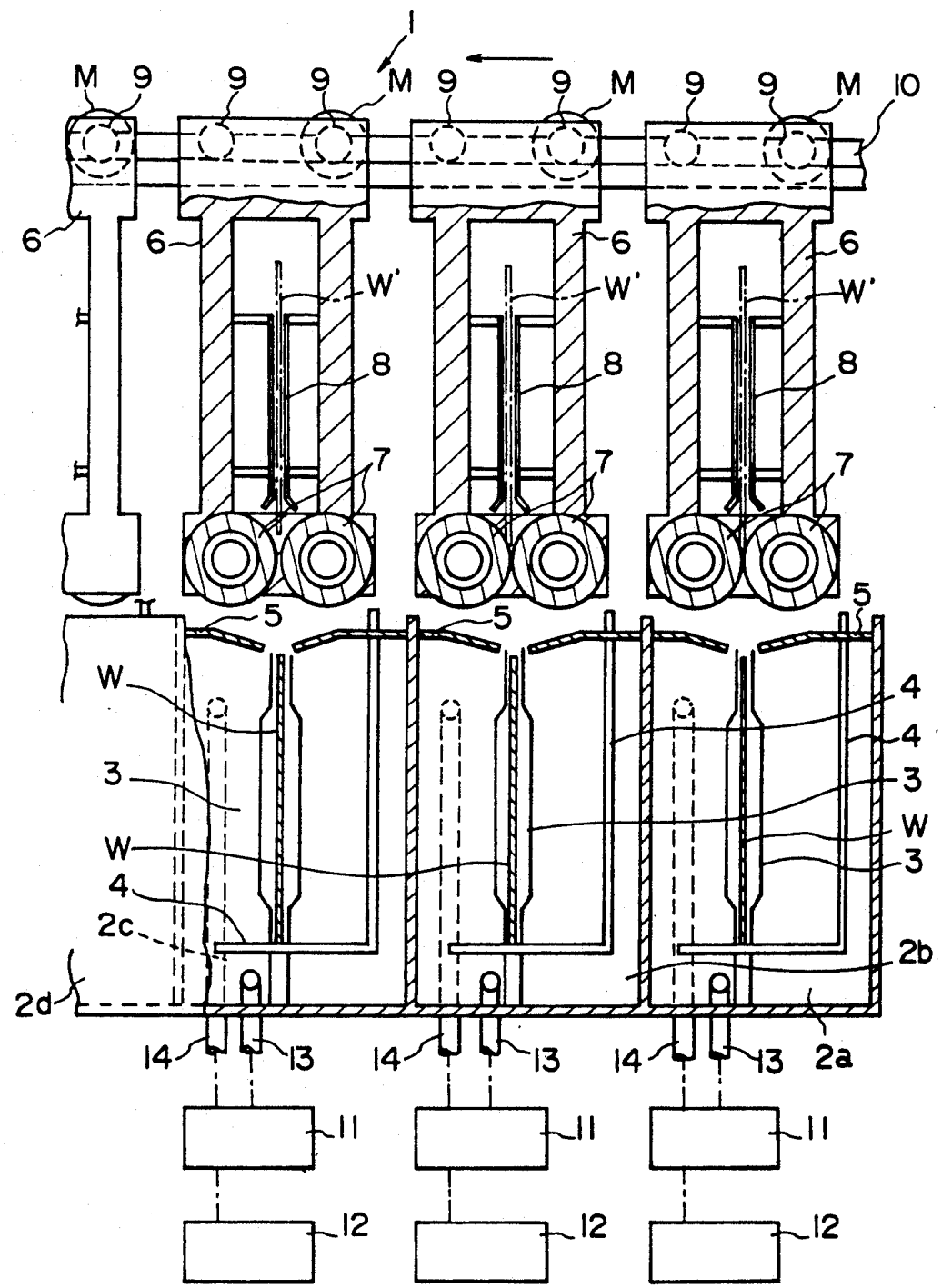
FIG. 1 is the partial cross-section illustrating the processing apparatus of the invention.

1. Processing apparatus
2a, 2b, 2c. Processing baths
3. Supporting means
4. Lifting means
5. Covering plate
6. Transporting unit
7. Rollers
8. Receiving means
9. Transporting roller
10. Guiding means
11. Storage tank for a processing solution
12. Regeneration unit for a processing solution
13, 14. Pipes
W. Work panel

DETAILED DESCRIPTION OF THE INVENTION

The processing apparatus of the invention is explained in detail with reference to FIG. 1.

A supporting means 3 for a work panel W, which consists of a pair of the opposite plates, is disposed in each of the processing baths 2a, 2b and 2c, in which the work panel is supported upward.

A lifting means 4 is moved up and down with a cylinder (not shown) to lift up and down the work panel which is kept upward by the supporting means.

A transporting unit 6 which is driven by a driving means (not shown) is disposed over the processing baths oppositely and parallel thereto.

A receiving means 8 is built in the transporting unit and receives the work panel lifted from the processing bath to transport it to the next processing bath.

A pair of rollers 7 are disposed oppositely to the processing bath on the lower end of the transporting unit. The rollers catch the work panel lifted by the lifting means therebetween and lift it up to the receiving means while squeezing it to remove the solution drains remaining thereon.

A guiding means for the transporting unit is disposed over the processing baths along the path on which the processing baths are disposed. The transporting units are hung from the guiding means via the transporting rollers and are moved by a driving means (not shown).

An opening at the top of the processing bath is covered with a shielding means made of the materials capable of resiting the solvent and chemicals, such as a fluorinated resin and a silicone rubber, in order to prevent the solvent or irritative chemicals contained in the processing baths from volatilizing.

Next, the operation of the processing apparatus of the invention is explained in detail.

The rollers 7 rotate to roll down the work panel W held in the receiving means 8 and insert it into the supporting means 3 in the processing bath 2a containing a solvent or a chemicals solution. The work panel is processed in the bath for a prescribed time. Then, the work panel is lifted by the lifting means 4 to the rollers, which catch the panel therebetween to roll it up to the receiving means while squeezing the panel to remove the solution drain remaining thereon. The panel held in the receiving means is transported to the next processing bath 2b with the transpoting unit.

The above operation is repeated for processing the work panel in the baths 2b, 2c and finally in the washing bath, and then the processed work panel is dried.

The guiding means is disposed in a circular form so that the transporting units can be moved endlessly in a fixed direction.

The respective processing baths are connected to the storage tanks 11 via the pipes 13 and 14. Further, the storage tank has a regeneration unit, in which the unnecessary components are removed and the short necessary components are supplemented to regenerate the processing solution. The regenerated processing solution is circulated between the storage tank and processing bath. The circulation of the processing solutions can provide a by-effect of stirring the processing solution in the processing bath.

The respective transporting units, lifting means and rollers for lifting up and down the working panel are controlled independently with a regulating unit (not shown) according to the program put beforehand into the regulating unit so that they can comply with the different processing times in the respective processing baths and the whole processing can be optimized.

The present invention can provide the following advantages:

1. The apparatus of the invention can comply flexibly with the different processing time in the respective baths;
2. the processing baths can be arbitrarily disposed, which can minimize the area necessary to settle the apparatus.
3. the capacities of the processing baths can be decreased by the circulation system of the processing solution, which results in reducing the whole size of the apparatus;
4. the consumption of the processing solutions can be saved by squeezing the work panel sufficiently with the rollers and bringing back the squeezed solutions to the baths; and
5. the environmental pollution problems caused by a volatile solvent and an irritative solution can be avoided with the apparatus of the invention.

What is claimed is:

1. A processing apparatus comprising:
   a) a plurality of processing baths each containing a processing solution,
   b) a support for a work panel disposed in each processing bath,
   c) a lift for said work panel in said support,
   d) a transporting unit disposed over said processing baths, said unit being driven by a driving means,
   (e) a pair of rollers adjacent an upper end of at least one processing bath and adjacent lower ends of said transporting units, said rollers adapted to move said work panel up into one of said transporting units, after said work panel has been lifted by said lift, and down into another one of said processing baths,
   f) a receiver in said transporting unit adapted to receive said work panel when said panel is lifted by said rollers or said lift, and
   g) a guide for said transporting unit disposed over said processing baths along a path on which said processing baths are disposed.

* * * * *